(12) United States Patent
Nakabayashi

(10) Patent No.: US 6,383,832 B1
(45) Date of Patent: May 7, 2002

(54) PRESSURE RESPONSIVE DEVICE AND METHOD OF MANUFACTURING SEMICONDUCTOR SUBSTRATE FOR USE IN PRESSURE RESPONSIVE DEVICE

(75) Inventor: Masakazu Nakabayashi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/956,805

(22) Filed: Sep. 21, 2001

(30) Foreign Application Priority Data

Apr. 16, 2001 (JP) ............................................ 13-116401

(51) Int. Cl.[7] .............................................. H01L 21/00
(52) U.S. Cl. .......................... 438/50; 257/415; 257/419
(58) Field of Search .................................. 257/414–419, 257/798; 438/50, 48, 53, 52, 800

(56) References Cited

U.S. PATENT DOCUMENTS 5,189,777 A * 3/1993 Guckel et al. ................ 29/424

FOREIGN PATENT DOCUMENTS

JP 11-334080 12/1999

* cited by examiner

*Primary Examiner*—Charles Bowers
*Assistant Examiner*—Craig Thompson
(74) *Attorney, Agent, or Firm*—Oblon, Spivak, McClelland, Maier & Neustadt, P.C.

(57) ABSTRACT

The invention provides a pressure responsive device capable of achieving thinning or miniaturization while maintaining a high performance and a method of manufacturing a semiconductor substrate for use therein.

A spacer means (6) made of polyimide is disposed on a semiconductor substrate (3) having a back plate (4), and a peripheral portion of a vibrating electrode membrane (8) is supported by the spacer (6), thereby forming a capacitor comprised of the back plate (4)/a space (9) (air)/the vibrating electrode membrane (8). Additionally, a silicon nitride membrane (7) serving as a flattening membrane is provided on the supporting surface of the spacer means (6) made of polyimide so that variation in thickness of the polyimide membrane in each apparatus is controlled. As a result, fluctuations in performance of each devices are suppressed and a highly reliable pressure responsive apparatus is obtained.

8 Claims, 5 Drawing Sheets

(a)

(b)

(c)

(d)

(e)

(f)

PRIOR ART

PRESSURE RESPONSIVE DEVICE AND METHOD OF MANUFACTURING SEMICONDUCTOR SUBSTRATE FOR USE IN PRESSURE RESPONSIVE DEVICE

BACKGROUND OF THE INVENTION

1. Technical Field

The present invention relates to a pressure responsive device such as an electret condenser microphone or a pressure sensor for use in a cellular phone or the like, and further to a method of manufacturing a semiconductor substrate for use in such a pressure responsive device.

2. Background Art

FIG. 7 is a sectional view showing a conventional electret condenser microphone for use in a cellular phone or the like. In the drawing, reference numeral 20 is a printed board on which a junction FET (hereinafter referred to as J-FET) 21 is mounted, and numeral 22 is a back plate. Numeral 23 is an electret membrane semi-permanently charged with an electrical charge (Q) by irradiating a polymer, e.g., polypropylene with an electronic beam. Numeral 24 is a spacer made of a plastic, and numeral 25 is a vibrating membrane disposed above the electret membrane 23 via the spacer 24 and coated with a surface electrode made of aluminum. This vibrating membrane 25 is opposite to the electret membrane 23 and the back plate 22 therebelow via a space, and forms a capacitor between these electret membrane 23 and back plate 22 and the vibrating membrane 25. Furthermore, numeral 26 is a retaining rubber for fixing the vibrating membrane 25. Numeral 27 is a holder for holding the back plate 22 and the electret membrane 23. Numeral 28 is a capsule including a vent hole 29, and numeral 30 is a cloth covering the vent hole 29.

In the conventional electret condenser microphone, the capacitor is constructed of the back plate 22, the electret membrane 23 and the vibrating membrane 25 having the surface electrode. When a sound pressure such as a sound or voice is transferred through the vent hole 29 of the capsule 28, the vibrating membrane 25 is vibrated by this sound pressure thereby a capacity (c) of the capacitor being varied. Since an electrical charge (Q) is constant, variation in a voltage (V) is produced on the basis of Q=CV. Applying the voltage variation to a gate electrode of J-FET 21 causes variation in drain current, which is detected in the form of voltage signal.

Since an electret condenser microphone is used for a take-along terminal, e.g., a cellular phone, further thinning and miniaturization thereof have been desired. In the conventional construction of above construction, however, the printed board 20, J-FET 21, the holder 27 and the like are used resulting in a large number of parts. Therefore thinning and miniaturization of the electret condenser microphone were difficult. Moreover in the mentioned conventional construction, a problem exists in that S/N ratio is lowered as being thin and small-sized, eventually resulting in worse performance.

SUMMARY OF THE INVENTION

The present invention was made in order to solve the above-discussed problems, and has an object of providing a pressure responsive device capable of achieving thinning or miniaturization thereof while maintaining a high performance. The invention also provides a method of manufacturing a semiconductor substrate for use therein.

A pressure responsive device according to the invention comprises: a package including a storage chamber in an interior thereof; means for introducing an outside pressure into the storage chamber; a semiconductor substrate placed in the storage chamber, provided with a pair of main surfaces opposite to each other; a first electrode disposed on one of the main surfaces; spacer means positioned in a peripheral portion of said first electrode and disposed on one of the main surfaces of the semiconductor substrate, the spacer means is composed of polyimide and having a supporting surface; and a vibrating membrane of which peripheral portion is supported by the supporting surface of the spacer means, the vibrating membrane includes a second electrode which is opposite to the first electrode via a space and forms a capacitor together with the first electrode.

In the pressure responsive device according to the invention, it is preferable that a flattening membrane for flattening the supporting surface of the spacer means is provided on the supporting surface of the spacer means.

In the pressure responsive device according to the invention, it is preferable that a silicon nitride membrane is used as the flattening membrane.

In the pressure responsive device according to the invention, it is preferable that the semiconductor substrate includes a conversion circuit for converting variation in capacity of the capacitor due to vibration in the vibrating electrode membrane into a voltage signal.

In the pressure responsive device according to the invention, it is preferable that the spacer means includes plurality of spacers forming communication clearances to the storage chamber therebetween.

In the pressure responsive device according to the invention, it is preferable that a thickness of the spacer means is in the range of 10 to 20 μm in a direction that the first electrode and second electrode are opposing to each other.

In the pressure responsive device according to the invention, it is preferable that an electret membrane formed by electrically charging a polymer coated with the second electrode is used as the vibrating membrane.

A method of manufacturing a semiconductor substrate according to the invention, the semiconductor substrate being used in the pressure responsive device and having spacer means composed of polyimide on one of a pair of main surfaces opposite to each other, comprises the steps of: applying polyimide onto a semiconductor substrate and setting the polyimide membrane at 300° C. to 370° C.; forming a silicon nitride membrane on the polyimide membrane; applying a resist onto the silicon nitride membrane and forming a resist pattern by a photomechanical process; etching the silicon nitride membrane using said resist pattern and as a mask; etching said polyimide membrane for forming the spacer means using said resist pattern and said silicon nitride pattern as a masks, and removing the resist after etching said polyimide membrane.

In the pressure responsive device of above construction according to the invention, spacer means composed of polyimide is disposed onto the semiconductor substrate having the first electrode on one of the main surfaces. Further, the peripheral portion of the vibrating membrane is supported by the supporting surface of the spacer means thereby forming a capacitor comprised of the first electrode/the space (air)/the second electrode. As a result, the number of parts becomes smaller than that in the conventional device of the same type and moreover each part is small-sized, and consequently it is possible to achieve thinning and miniaturization of the device while maintaining a high performance.

Further, in the mentioned pressure responsive device wherein the flattening membrane is provided on the supporting surface of the spacer means to flatten the supporting surface, or wherein the silicon nitride membrane is utilized as this flattening membrane, it is possible to prevent irregularity in thickness of the polyimide spacer means in each device. Consequently, irregularity in performance of each device is also suppressed and thus a highly reliable pressure responsive device can be obtained. Furthermore, in the mentioned pressure responsive device wherein the thickness of the spacer means is 10 to 20 μm in the direction that the first electrode and second electrode are opposing to each other, the spacer means can be made to effectively respond to even slight and small vibrations of the vibrating membrane. Additionally, in the mentioned pressure responsive device wherein the semiconductor substrate is provided with the conversion circuit for converting variation in capacity of the capacitor into electric signals, the electric signals can be easily fetched. Further, in the mentioned pressure responsive device wherein the spacer means includes plurality of spacers forming communication clearances to the storage chamber, there is an advantage of achieving more free vibrations of the vibrating membrane. In the mentioned pressure responsive membrane wherein an electret membrane formed by electrically charging a polymer coated with the second electrode is used as the vibrating membrane, vibrations of the vibrating membrane can be effectively converted into variation in capacity of the capacitor.

Furthermore, in the mentioned method of manufacturing the semiconductor substrate according to the invention, the semiconductor substrate having the spacer means composed of polyimide can be easily manufactured on one of the main surfaces in the same manner as the conventionally known method of manufacturing a semiconductor apparatus. Therefore, it is possible to manufacture economically and in large quantity the semiconductor substrate used in the pressure responsive device.

DESCRIPTION OF THE PREFERRED EMBODIMENTS

Embodiment 1

Figure 1:
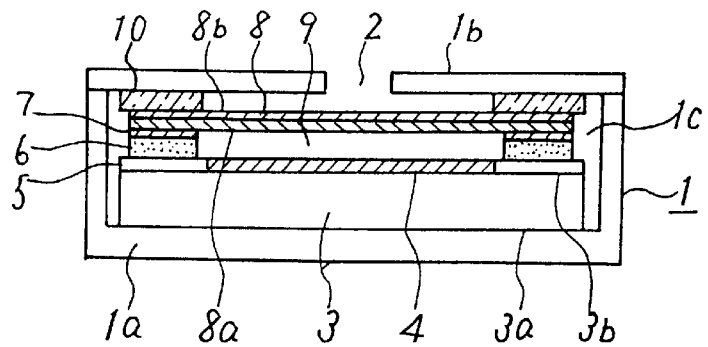
FIG. 1 is a sectional view showing a structure of an electret condenser microphone (ECM) according to a first preferred embodiment of the present invention.

A preferred embodiment of the present invention is hereinafter described with reference to the drawings. FIG. 1 is a sectional view showing a construction of an electret condenser microphone (hereinafter referred to as ECM), which is a pressure responsive device according to a first preferred embodiment of the invention. In the drawing, reference numeral 1 is a package having a storage chamber 1c constructed in an airtight manner in an interior thereof. This package 1 is comprised of a package body 1a having a sleeve-like part at an external edge portion of a bottom and a top closure 1b covering an upper end of the package body 1a in an airtight manner. Numeral 2 is a vent hole formed in the top closure 1b as means for introducing an outside pressure into the storage chamber 1c. Numeral 3 is a semiconductor substrate placed in the storage chamber 1c, and is constructed of a semiconductor material, for example, silicon. This semiconductor substrate 3 is provided with a pair of main surfaces 3a, 3b opposite to each other, and in the central part of the main surface 3b being one of the main surfaces, includes a back plate 4 being an electrode membrane made of aluminum. Further, the other main surface 3a of the semiconductor substrate 3 is bonded to an inner face of the bottom of the package body 1a with a resin or solder.

Numeral 5 is a silicon oxide membrane formed around the periphery of the back plate 4 on the main surface 3b of the semiconductor substrate 3. The silicon oxide membrane 5 is adhered to the semiconductor substrate 3 using a method of thermal oxidation of the silicon substrate 3, a method of normal pressure CVD and P-CVD or the like. Numerals 6 is a spacer means which includes a plurality of spacers 6h–6k disposed via the silicon oxide 5 on the main surface 3b being one of the main surfaces of the semiconductor substrate 3 around the back plate 4. These plural spacers 6h–6k are manufactured of polyimide and the membrane is 10 to 20 μm in thickness, for example, 15 μm.

Figure 2:
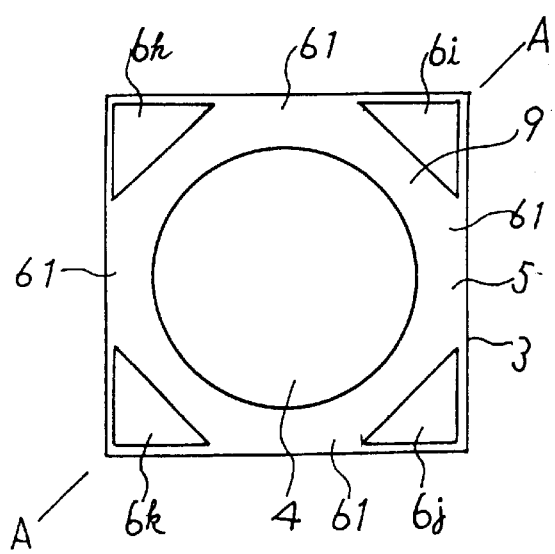
FIG. 2 is a top plan view of the semiconductor substrate used in ECM according to the first embodiment of the invention.

FIG. 2 is a plan view of the semiconductor substrate 3 for use in ECM of this embodiment, in which a square-shaped semiconductor substrate 3 is employed. The main surface 3b being one of the main surfaces thereof is provided with the circular back plate 4 in the central portion. The mentioned plurality of spacers 6h–6k are positioned in a peripheral portion of the back plate 4, and disposed on the silicon oxide 5 formed around the back plate 4. Four spacers 6h–6k are disposed such that they are located at each corner of the square-shaped semiconductor substrate 3, thereby substantially forming a triangular-prism. A clearances 61 are provided between two of the plural spacers 6h–6k. A space 9 surrounded by the plural spacers 6h–6k communicates to the storage chamber 1c.

Furthermore, numeral 7 is a flattening membrane formed on an upper supporting surface of each of the plural spacers 6h–6k in order to flatten the polyimide surface. The flattening membrane 7 is formed for the purpose of flattening the upper supporting surface of each spacer 6h–6k made of polyimide. This flattening membrane 7 is composed of a silicon nitride membrane in this embodiment. Numeral 8 is a square-shaped vibrating membrane, and a peripheral edge portion thereof, more specifically, four corner portions are fixed onto the upper supporting surfaces of spacers 6h–6k. The vibrating membrane 8 includes electrode membrane 8b is opposite to the back plate 4 via the space 9 and forms a capacitor together with the back plate 4. In this embodiment, an electret membrane, in which a polymer 8a such as polypropylene is coated with a surface electrode 8b made of aluminum, is employed as the vibrating membrane 8. Based on such a construction of the vibrating membrane 8, the mentioned capacitor is comprised of the back plate 4/the space 9 (air)/the surface electrode 8b of the vibrating membrane. Numeral 10 is means for fixing the vibrating membrane 8. Four fixing means are provided to fix the peripheral edge portion, specifically, the four corner portions of the vibrating membrane 8 to the semiconductor substrate 3 via the spacers 6h–6k. The fixing means is a retaining rubber made of silicon in this embodiment.

Note that, in this embodiment, the semiconductor substrate 3 is formed by integrally incorporating various signal-processing circuits into the silicon substrate. These signal-processing circuits include a conversion circuit by which variation in capacity of the capacitor due to vibrations of the vibrating electrode membrane 8 is converted into voltage signal and detected, an amplifier circuit, a noise reduction circuit for improving a sound quality, an equalizer and the like (the signal-processing circuits are not shown in the drawings).

Now, operation is hereinafter described. In the ECM according to this embodiment, the capacitor is comprised of the back plate 4 formed in the semiconductor substrate 3 and the electrode membrane 8b of the vibrating membrane 8. By previously irradiating the vibrating membrane 8 with an electronic beam, an electrical charge (Q) is semi-permanently fixed to the polymer 8a of vibrating membrane 8. When introducing an outside sound pressure such as sound through the vent hole 2 of the top closure 1b into the storage chamber 1c, the sound pressure vibrates the vibrating membrane 8. As a result, variation in a capacity (C) of the capacitor is produced. On the basis of Q=CV, the electrical charge (Q) is constant, and therefore variation in a voltage (V) appears. The semiconductor substrate 3 converts the variation in the capacity into voltage signal, detects and amplifies the signal and then outputs the signal with improvement in sound quality thereby performing a function of a microphone.

Next, a method of manufacturing the semiconductor substrate 3 used in the ECM of this embodiment is hereinafter described. In particular, a step of forming the spacer means 6 made of polyimide on the main surface 3b being one of a pair of the main surfaces 3a, 3b opposite to each other is hereinafter described with reference to FIGS. 3(a) to (f). In the drawings, reference numeral 6A is the polyimide membrane, numeral 6 is the spacer means of polyimide, and numeral 11 is a resist. Additionally, in the drawings, the same reference numerals are designated to the same or like parts.

Figure 3:
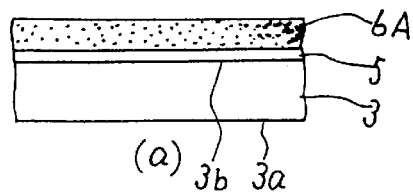
FIGS. 3(a) to (f) are sectional views respectively showing a method of manufacturing the semiconductor substrate used in ECM according to the first embodiment of the invention.
Figure 3:
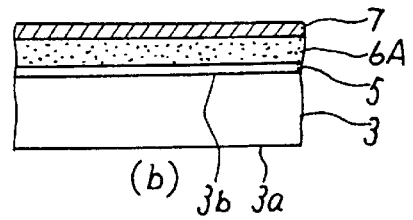
Figure 3:
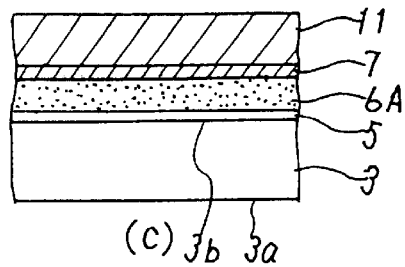
Figure 3:
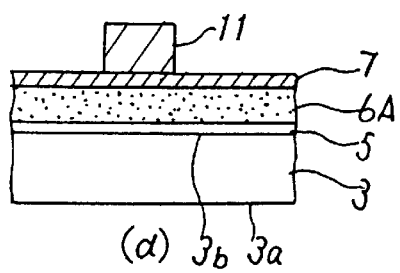
Figure 3:
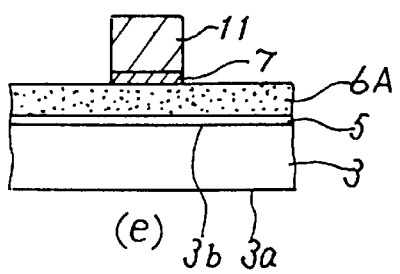
Figure 3:
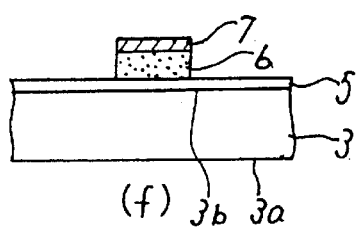

First, the polyimide membrane 6A is applied by spin-coat method onto the main surface 3b being one of the main surfaces of the semiconductor substrate 3 on the surface of which the silicon oxide membrane 5 is formed (FIG. 3(a)). Then, the polyimide membrane 6A is cured at 300° C. to 370° C. thereby setting the polyimide membrane 6A. Next, the silicon nitride membrane 7 is formed on the polyimide membrane 6A by P-CVD method (FIG. 3(b)). Subsequently, the resist 11 is applied onto the silicon nitride membrane 7 (FIG. 3(c)). Then the resist 11 is patterned into a desired resist pattern by photomechanical process (FIG. 3(d)). Thereafter, using this resist pattern 11 as a mask, the silicon nitride membrane 7 is dry-etched by CF4 gas (FIG. 3(e)). Subsequently, using the resist membrane 11 and the silicon nitride membrane 7 lying thereunder as the masks, the polyimide membrane 6A is etched by Polyimide Etchant (produced by Hitachi Chemical Co., Ltd.) a principal component of which is hydrazine. Further, the resist 11 is removed by O2 gas-plasma. As a result, the spacer means 6, on the surface of which the silicon nitride membrane 7 is formed as a flattening membrane and which is made of polyimide, has been manufactured (FIG. 3(f)). In addition, the four spacers 6h–6k illustrated in FIGS. 1 and 2 are simultaneously formed through the steps shown in FIGS. 3(a) to (f).

The polyimide membrane of the spacer 6 is suitably 10 to 20 μm A in thickness. However, in this embodiment, the membrane is designed to be 15 μm in thickness, and an allowance thereof is (15±3) μm. The thickness of the polyimide membrane of the spacer means 6 bears a direct relation to a value of the capacity of the capacitor greatly affecting the performance of microphone. When establishing the thickness of the polyimide membrane to be thinner than a designed value, it is certain that S/N ratio improves resulting in enhancement of sensitivity of microphone. But, it comes out that fluctuation or irregularity in sensitivity of each microphone increases and that the vibrating membrane 8 is likely to be adsorbed to the back plate 4 formed on the semiconductor substrate 3, eventually resulting in deterioration of sensitivity in high-sound regions. On the contrary, when establishing the thickness of the polyimide membrane to be thicker than the designed value, it is certain that fluctuation or irregularity in sensitivity of each microphone is suppressed. But the sensitivity of microphone is deteriorated. Therefore, it is important to control as much as possible variation or difference from the designed value of the thickness of the polyimide membrane.

Figure 4:
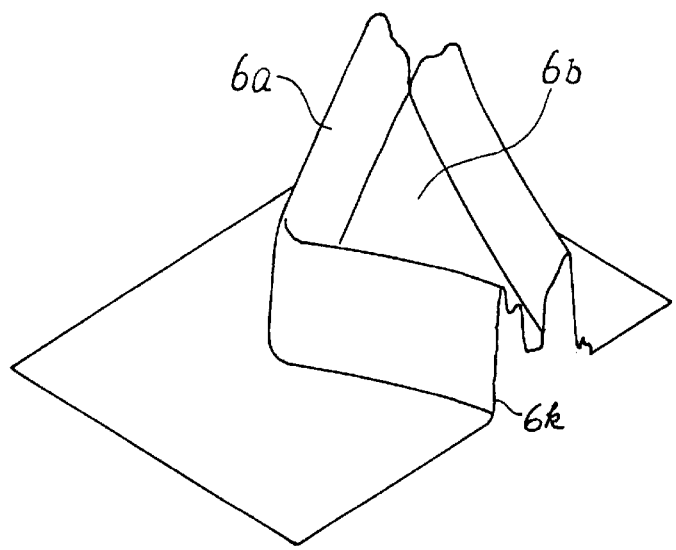
FIG. 4 is a view of a surface of a spacer, which is solely made of polyimide, viewed through an electron microscope in ECM according to the first embodiment of the invention.
Figure 5:
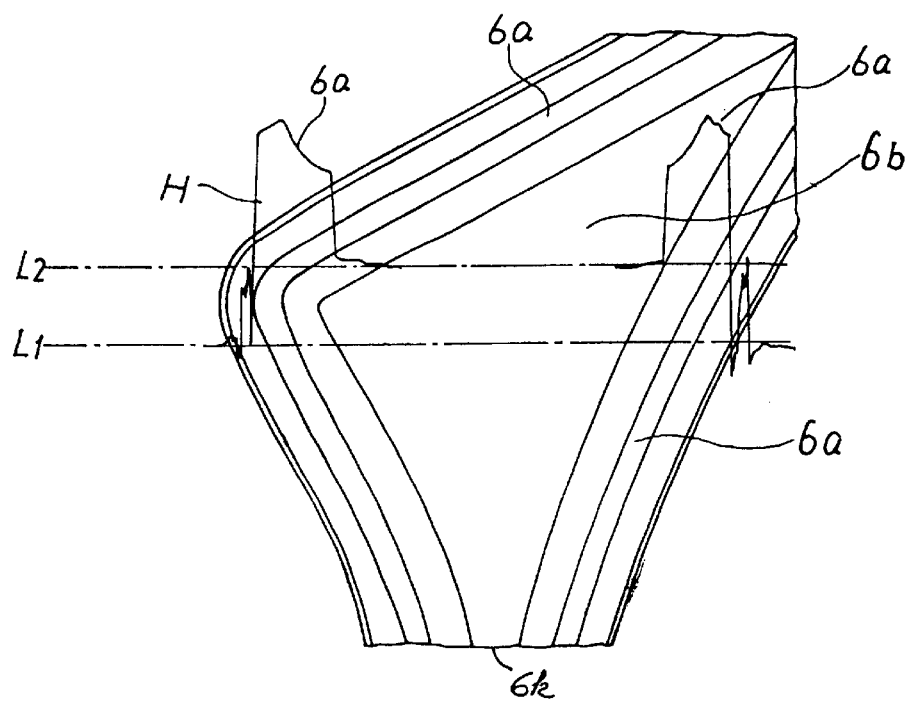
FIG. 5 is a view of the surface of the spacer means, which is solely made of polyimide, viewed through the electron microscope in ECM according to the first embodiment of the invention.

In this embodiment, the silicon nitride membrane 7 serving as a flattening membrane is formed on the spacer means 6 of polyimide. It is certain that the spacer means 6 performs its function as a spacer even if the silicon membrane 7 would not be formed. But, in the case of a spacer, on the surface of which the silicon nitride membrane 7 is not formed and which is solely composed of polyimide, it is known that an inner portion of the surface of polyimide is depressed resulting in a concave with its outer peripheral portion swollen. It is considered that this concave is produced due to the fact that polyimide is contracted and/or deformed by heat in the manufacturing processes thereof. Such a contraction or deformation causes variation in thickness of the polyimide membrane in each microphone. FIGS. 4 and 5 are views of the supporting surface of the spacer means 6 not provided with the silicon nitride membrane 7 but made solely of polyimide, illustrated by observation through a microscope. FIG. 5 corresponds to a plan view of the triangular prism-shaped spacer 6k shown in FIG. 4. In FIG. 5, two parallel reference lines L1, L2 are additionally drawn, and change in height of a swell between these reference lines L1, L2, is illustrated as a curve H. In FIGS. 4 and 5, numeral 6a is a convex portion where the outer peripheral portions of the supporting surface of the spacer means 6, which is made of polyimide, are swollen. Numeral 6b illustrates a concave portion where the surface of polyimide is depressed in the inner portion of the convex portion 6a. As is obvious from FIGS. 4 and 5, it is understood that the surface of the convex portion 6a is not flat but has an inclination.

Figure 6:
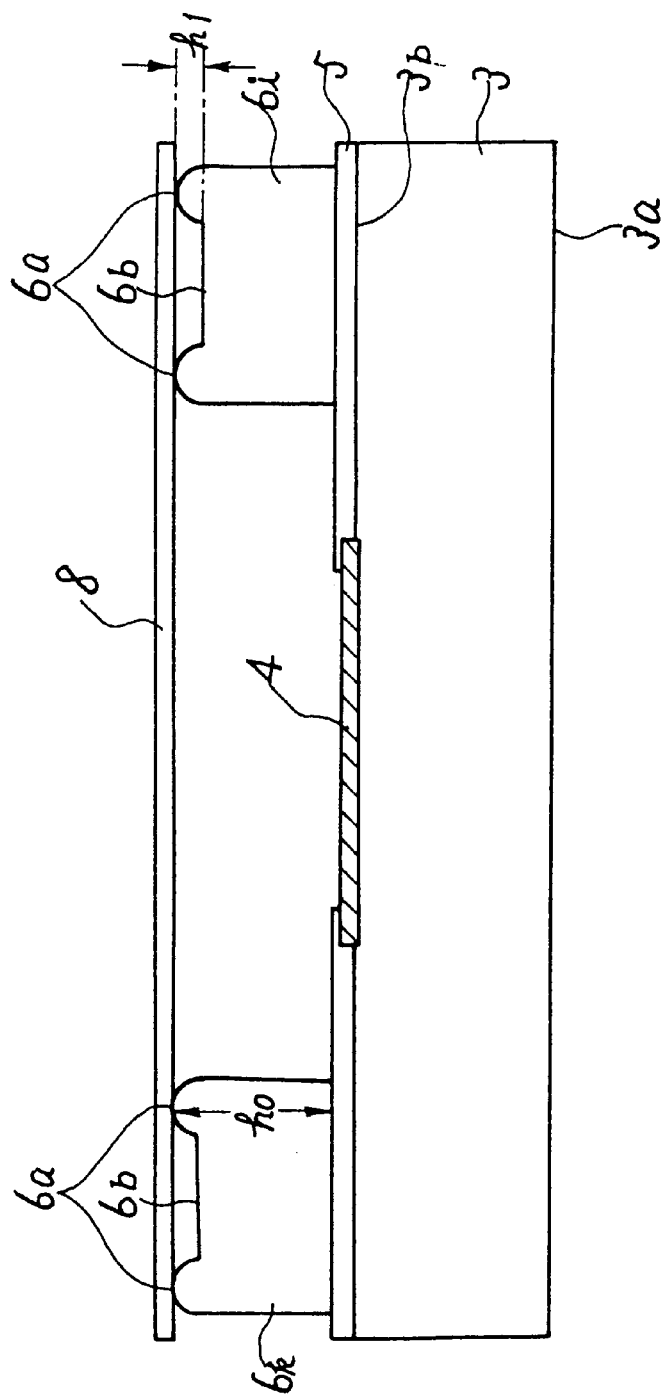
FIG. 6 is a schematic sectional view showing the case of using the spacer means, which is solely made of polyimide, in ECM according to the first embodiment of the invention.
Figure 7:
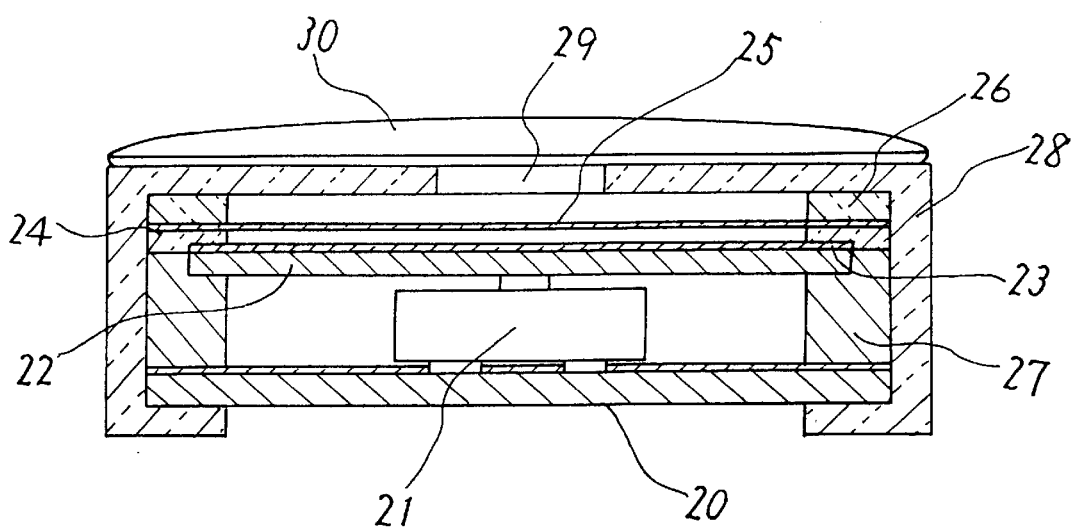
FIG. 7 is a sectional view showing a construction of the conventional ECM.

In addition, FIG. 6 is a sectional view taken substantially along the line A—A in FIG. 2 in the case of employing the spacer means 6 solely made of polyimide in the ECM according to this embodiment. In the case of the spacer means 6 where the membrane thereof is designed to be 15 μm in thickness, configuration thereof becomes such that the convex portion 6a being the outer peripheral portion of the surface of polyimide is swollen by a height h1 over the concave portion 6b being the inner peripheral portion. This height h1 is approximately 2 μm. A height h2 of this convex portion 6a from the silicon oxide membrane 5 is (15±3 μm). In order to prevent this polyimide from contraction or deformation, it is effective that the silicon nitride membrane 7 serving as s a flattening membrane is formed on the surface of polyimide. Because the silicon nitride membrane 7 is an extremely dense-grained membrane and scarcely deformed due to heat, it allows the surface of polyimide coated with the silicon nitride membrane 7 to be flattened. As a result, variation or irregularities in thickness of the polyimide membrane in each microphone are controlled. In this sense, it is preferable that the silicon nitride membrane 7 serving as a flattening membrane is provided onto the spacer means 6 composed of polyimide.

As described above, in the preferred embodiment, the spacer means 6, which is made of polyimide, is disposed onto the semiconductor substrate 3 including the back plate 4 in the main surface 3b being one of the main surfaces. Further the peripheral edge portion of the vibrating membrane 8 is fixed to this spacer means 6. In this manner, a capacitor comprised of the backplate 4/the space 9 (air)/the vibrating membrane 8 is formed. Provided furthermore in the semiconductor substrate 3 are signal-processing circuits such as a conversion circuit converting variation in capacity of the capacitor due to vibrations of the vibrating membrane 8 into voltage signal and detecting the signal, an amplifier circuit, a noise reduction circuit for purpose of improving a sound quality, an equalizer circuit and the like. In this preferred embodiment, as a result of using the semiconductor substrate 3 and the spacer means 6 mounted thereon, number of parts comes to be smaller than that in the conventional ECM and each part is small-sized. Therefore, it becomes possible to achieve thinning or miniaturization while maintaining a high performance. Furthermore, the silicon membrane 7 serving as a flattening membrane is provided onto the spacer means 6 made of polyimide to flatten the supporting surface of the spacer means 6, whereby variation in thickness of the polyimide membrane in each microphone is controlled. Consequently, fluctuation in sensitivity of each microphone is controlled resulting in improvement in product reliability.

In the foregoing preferred embodiment, as the vibrating membrane 8 forming a capacitor together with the back plate 4 mounted on the semiconductor substrate 3, an electret membrane wherein the polypropylene is coated with electrode is used as an example. However, the invention is not limited to such example, but it is also preferable to utilize, for example, any other polymer, ceramic membrane or the like. Further, although ECM is described taking as an example in the foregoing embodiment, note that the invention is also applicable to a pressure sensor. Furthermore, the spacer means 6, on the surface of which the silicon nitride membrane 7 is formed and which is fabricated of polyimide, may be used not only in the case of disposing the vibrating membrane 8 on the semiconductor substrate 3 but in the case of placing a semiconductor substrate or other parts onto the semiconductor substrate. In this manner, the spacer means 6 is broadly available for various devices.

What is claimed is:

1. A pressure responsive device comprising:
   a package including a storage chamber in an interior thereof;
   means for introducing an outside pressure into said storage chamber;
   a semiconductor substrate placed in said storage chamber, provided with a pair of main surfaces opposite to each other;
   a first electrode disposed on one of the main surfaces;
   spacer means positioned in a peripheral portion of said electrode and disposed on one of the main surfaces of said semiconductor substrate, said spacer means is composed of polyimide and has a supporting surface; and
   a vibrating membrane of which peripheral portion is supported by said supporting surface of said spacer means, said vibrating membrane includes a second electrode which is opposite to said first electrode via a space and forms a capacitor together with said first electrode.

2. The pressure responsive device according to claim 1, wherein a flattening membrane for flattening said supporting surface of said spacer is provided on said supporting surface of said spacer means.

3. The pressure responsive device according to claim 2, wherein a silicon nitride membrane is used as said flattening membrane.

4. The pressure responsive device according to claim 1, wherein said semiconductor substrate includes a conversion circuit for converting variation in capacity of said capacitor due to vibration in the vibrating membrane into a voltage signal.

5. The pressure responsive device according to claim 1, wherein said spacer means including a plurality of spacers forming communication clearances to said storage chamber therebetween.

6. The pressure responsive device according to claim 1, wherein a thickness of said spacer means is in the range of 10 to 20 $\mu$m in a direction that said first electrode and second electrode are opposing to each other.

7. The pressure responsive device according to claim 1, wherein an electret membrane formed by electrically charging a polymer coated with said second electrode is used as said vibrating membrane.

8. A method of manufacturing a semiconductor substrate, the semiconductor substrate being used in the pressure responsive device and having a spacer means composed of polyimide on one of a pair of main surfaces opposite to each other, comprising the steps of:
   applying polyimide onto a semiconductor substrate and setting the polyimide membrane at 300° C. to 370° C.;
   forming a silicon nitride membrane on said polyimide membrane;
   applying a resist on said silicon nitride membrane and forming a resist pattern by a photomechanical process;
   etching said silicon nitride membrane using said resist pattern as a mask for forming a silicon nitride pattern;
   etching said polyimide membrane for forming said spacer means using said resist pattern and said silicon nitride pattern as a masks, and
   removing said resist pattern after etching said polyimide membrane.

* * * * *

UNITED STATES PATENT AND TRADEMARK OFFICE
CERTIFICATE OF CORRECTION

PATENT NO.    : 6,383,832 B1
DATED         : May 7, 2002
INVENTOR(S)   : Nakabayashi It is certified that error appears in the above-identified patent and that said Letters Patent is hereby corrected as shown below:

<u>Title page,</u>
Item [30], the Foreign Application Priority Data is incorrect.  Item [30] should read as follows:

-- [30]              Foreign Application Priority Data

Apr. 16, 2001   (JP) ............................................. 2001-116401 --

Signed and Sealed this

Twenty-sixth Day of November, 2002

Attest:

Attesting Officer

JAMES E. ROGAN
*Director of the United States Patent and Trademark Office*